(12) United States Patent
Familia

(10) Patent No.: US 7,564,314 B2
(45) Date of Patent: Jul. 21, 2009

(54) SYSTEMS AND ARRANGEMENTS FOR OPERATING A PHASE LOCKED LOOP

(75) Inventor: Noam Familia, Modiin (IL)

(73) Assignee: Intel Corporation, Santa Clara, CA (US)

( * ) Notice: Subject to any disclaimer, the term of this patent is extended or adjusted under 35 U.S.C. 154(b) by 89 days.

(21) Appl. No.: 11/714,640

(22) Filed: Mar. 5, 2007

(65) Prior Publication Data

US 2008/0218275 A1      Sep. 11, 2008

(51) Int. Cl.
*H03L 7/00* (2006.01)
(52) U.S. Cl. .............. 331/16; 331/1 A; 331/177 R; 331/34; 327/156; 375/376
(58) Field of Classification Search .............. 331/16, 331/34
See application file for complete search history.

(56) References Cited

U.S. PATENT DOCUMENTS 5,838,202 A * 11/1998 Kosiec et al. ............ 331/1 A
7,062,229 B2 * 6/2006 Dunworth et al. ............ 455/76

OTHER PUBLICATIONS

Bashir, Amir, et al., "Fast Lock Scheme for Phase Locked Loops and Delay Locked Loops", (Mar. 31, 2006).

* cited by examiner

*Primary Examiner*—Arnold Kinkead
(74) *Attorney, Agent, or Firm*—Schubert Osterrieder & Nickelson PLLC; Erik J. Osterrieder

(57) ABSTRACT

Systems, methods and media for a fast locking phase locked loop (FLPLL) are disclosed. A FLPLL apparatus can include a voltage controlled oscillator (VCO) coupled to a phase frequency detector and can also include a frequency divider as part of a feedback loop. The VCO can accept a pull up voltage and a control signal from the phase frequency detector and provide an output clock signal to circuits that need synchronization. Such a configuration can greatly reduce the time the PLL requires to go from a dormant state to a fully operational state. During this start up mode, a frequency detection module can be utilized to detect an output frequency of the voltage controlled oscillator and when the VCO output frequency is not as high as a reference frequency, the frequency detection module can disabled the feedback loop during this start-up mode.

10 Claims, 4 Drawing Sheets

SYSTEMS AND ARRANGEMENTS FOR OPERATING A PHASE LOCKED LOOP

FIELD OF DISCLOSURE

The present disclosure is in the field of circuits and more particularly to the field of phase locked loops.

BACKGROUND

Generally, clock signals are required to synchronize data communication between circuits in a computing and/or in a communication device. Thus, these clock signals are ubiquitous in data processing systems and communication systems. There are also many other applications that require high speed quality clock signals. For example, radio frequency transmitters and receivers, navigation equipment and other serial link telecommunications equipment also typically requires robust clock signals. Phase locked loops, (PLL) are often utilized to generate precision clock signals from a system clock. PLLs typically have a voltage controlled oscillator (VCO) where a feedback loop controls the frequency of the VCO to provide and accurate clock output where the PLL maintains a constant phase angle relative to a reference signal. PLLs are widely used in communications for coherent carrier tracking and threshold extension, bit synchronization, and symbol synchronization.

The consumers demand for improved mobile products such as cell phones, portable computers etc., is driving the need for improved performance from these devices. One such area needing improvement is reducing the time for a device to power up or recover from a sleep mode. One component in mobile products that takes a longer time than other components to recover from a sleep mode is a PLL. Since most of devices utilize PLLs, fast locking PLLs designs have become an area of concentrated effort lately.

Accordingly, a fast locking PLL will allow a device to be able to quickly transition from a power saving "sleep mode" to a fully operational mode more quickly. One way to improve PLL lock time is by forcing the PLL to start at a frequency close to the required frequency. Generally, a PLL must be operational before other system components are activated otherwise serious failures or errors can result. One traditional method of PLL startup is to set a bias voltage of the VCO to a predetermined reference voltage that produces a startup frequency close to the target or desired frequency. Although this is a relatively simple solution, this topology has many disadvantages including a relatively slow startup.

For example, the startup frequency nearly always has to change from zero to the target frequency and the signals will often skew during this process. During the locking process, the PLL will also have to cover large frequency gaps. Some of these phenomena are due to interruptions caused by the feedback loop. Additionally, dead zone properties often occur when a PLL is close to achieving a phase-lock and such instabilities can cause an errant clock signal. Also for a significant time after startup such a configuration can create significant clock signal jitter.

Additionally, PLLs are generally required to generate different frequencies for different modes of operation, so a predetermined voltage for a predetermined startup frequency for a specific PLL cannot always be fitted to all required operational modes. Many traditional PLLs utilize a self-biased PLL architecture with "chopper circuits." This PLL architecture suffers from long lock time because the chopper circuit reduces the speed of the VCO frequency shift during the locking process. Hence, a PLL with faster locking capacity would be useful.

BRIEF DESCRIPTION OF THE DRAWINGS

Aspects of the embodiments will become apparent upon reading the following detailed description and upon reference to the accompanying drawings in which, like references may indicate similar elements.

DETAILED DESCRIPTION OF EMBODIMENTS

Figure 1:
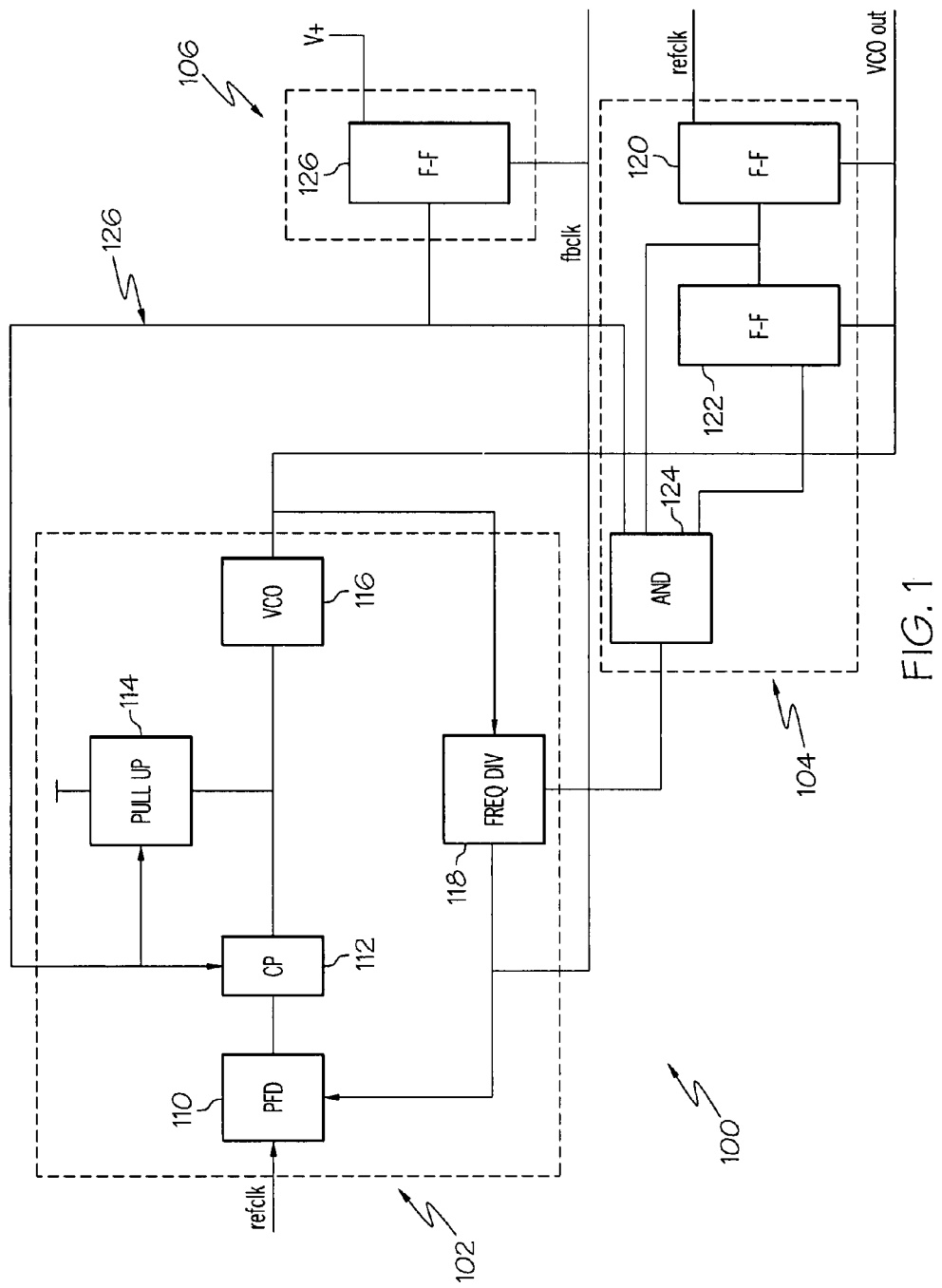
FIG. 1 depicts a block diagram of a fast start phase locked loop (PLL)

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

While specific embodiments will be described below with reference to particular configurations of hardware and/or software, those of skill in the art will realize that embodiments of the present disclosure may advantageously be implemented with other equivalent hardware and/or software systems. Aspects of the disclosure described herein may be stored or distributed on computer-readable media, including magnetic and optically readable and removable computer disks, as well as distributed electronically over the Internet or over other networks, including wireless networks. Data structures and transmission of data (including wireless transmission) particular to aspects of the disclosure are also encompassed within the scope of the disclosure.

Systems, methods and media for a fast locking phase locked loop (FLPLL) are disclosed herein. The FLPLL apparatus can include a voltage controlled oscillator (VCO) coupled to a phase frequency detector and can also include a frequency divider as part of a feedback loop. The VCO can accept a pull up voltage and a control signal from the phase frequency detector and provide an output clock signal to circuits that need synchronization. Such a configuration can greatly reduce the time the PLL requires to go from a dormant state to a fully operational state. During this startup mode, a frequency detection module can be utilized to detect an output frequency of the voltage controlled oscillator, and when the VCO output frequency is not as high as a reference frequency, the frequency detection module can disabled the feedback loop during this startup mode. Once the VCO frequency reaches the target frequency, or the reference frequency then the PLL can transition from the startup mode to an operational mode.

The frequency divider can be coupled between the phase frequency detector and the VCO, wherein the frequency detection module can disable the output of the frequency divider in response to the detected VCO output clock signal being less than a predetermined frequency or the target frequency. In addition, a charge pump can be connected to the phase frequency detector and to the VCO to provide an appropriate feedback voltage to the VCO. The frequency detection module can be implemented as a set of flip flops with a triple AND gate or some other form of a state machine.

In another embodiment, a method of operating a phase locked loop is three different modes is disclosed. The PLL can be placed into a sleep mode, then a start up mode, and then can transition to a "steady state" operating mode. The term steady state is utilized loosely herein because a typical PLL is always correcting itself based on feedback and never fully achieves a steady state. So the term steady state should be interpreted as a state where the PLL can provide an acceptable output clock signal. The disclosed method can reduce the amount of time delay that occurs during the startup mode or during the transition between a sleep mode and a steady state of operational mode. The method can include biasing a voltage controlled oscillator, detecting an output frequency of the voltage controlled oscillator and disabling or blocking a feedback signal to the voltage controlled oscillator in the startup mode when the detected VCO output frequency is less than a reference frequency.

In one embodiment, the feedback loop can be disabled by resetting a frequency counter in the frequency divider when the output frequency of the VCO is less than a predetermined target frequency as determined by a reference clock. The reference clock can be synchronized with the VCO clock before the feedback divider is reset such that a seamless transition from the start up mode to the operational mode can occur. The frequency divider can complete counting to the required number (for example from 1 to 40 for a divide by 40 type divider) from one reference clock edge to the next reference clock edge and when the count reaches the divider value the feedback clock to the phase frequency detector can toggle, indicating that the VCO has reached the required frequency and the PLL can begin the operational mode.

Referring to FIG. 1, a fast locking phase locked loop FLPLL 100 is illustrated. In one embodiment, FLPLL 100 can be similar to traditional PLLs with the exception of a startup control feature that allows the FLPLL 100 to reach a stable oscillating state considerably faster than traditional PLLs in accordance with the arrangements of the present disclosure. In fact, the FLPLL 100 disclosed can achieve a loop lock as much as three times faster than current state of the art PLLs. The FLPLL 100 can include a PLL 102, a frequency detection module 104 and an edge detection module 106. The PLL 102 can include a phase frequency detector (PFD) 110, a charge pump 112, a pull up module 114, a local oscillator or voltage controlled oscillator (VCO) 116, and a frequency divider 118. The frequency detection module 104 can include an AND gate 124 and flip-flops 120 and 122, while the edge detection module 106 can include a flip-flop connected to a logic high and to a start up control line. Generally, the frequency detection module 104 can drive a reference clock and can provide synchronization of clocks. Edge detection circuit can detect if and when feedback is being sent to the PLL 102.

In one embodiment the FLPLL 100 can have four different modes, an off mode, a start up mode, a "steady state" or operating mode and a sleep mode. During normal or steady state operation, a low frequency reference signal can be provided to the input of the PFD 110 from an outside source possibly from a system clock. The reference signal provided to the input of the PLL 102 is often referred to as a "global" system clock that is distributed to the majority of systems that are co-located with the PLL 102 on the same chip or integrated circuit. The PFD 108 can drive the charge pump 112 with a signal based on a detected phase difference between the reference signal and the feedback loop signal provided by the frequency divider module 118.

The output of the charge pump 112 can be fed to the VCO 116, and the charge pump output can control the frequency of a clock signal at the output of the VCO 116. The output signal of the VCO 116 can drive timing sensitive components such as data bus transceivers and synchronized microprocessor logic. A signal can be split off of the output of the VCO 116 to create a feedback loop that is feed to frequency divider 116. The feedback signal from the output of the VCO 114 can be divided by the 1/N in the feedback module 118 where N is the value of the divider. The divided signal can be supplied to the PFD 110 to complete the feedback loop. Such a feedback system allows the PLL 102 to provide a precise, robust high frequency clock signal to a microprocessor core or other circuits that need timing synchronization. Although only a single stage PLL 102 is illustrated, a dual or multistage stage PLL could also utilize the teachings herein.

It has been determined that the feedback loop can operate at a frequency of one tenth of the PLL's output frequency and maintain adequate system stability. If the PLL of the present disclosure is utilized for clock generation in a clock and data recovery application or anther digital communication system, the frequency of the feedback loop may operate at a couple of GHz. However, the actual frequency of the feedback loop can depend on the target clock speed in such an embodiment.

In accordance with the present disclosure, the output of the feedback divider 118 can be disabled by the frequency counter module 104 during a start up procedure, and such a feature can quickly drive the VCO to higher frequencies until a phase lock is achieved by the PLL 102. Bias module 114 can provide a bias voltage to the VCO 116 during start up. The frequency detection module 104 can disable the divider during a startup phase and this can boost the lock speed of the PLL without the need to accurately control the bias from the bias module 114 on startup.

When the frequency detection module 104 is utilized to disable the feedback loop, the VOC can start oscillating at a frequency that is close to the target frequency, thereby facilitating a quick "lock" from a sleep mode. The frequency detection module 104 can be utilized in cooperation with a frequency divider 118 of the PLL's feedback and several flip-flops 122 and 120 that can perform as a state machine. In one embodiment, the PLL reference clock frequency (refclk) can be set at 100 MHz and the VCO frequency (vco out) can be 4 GHz. For a VCO frequency of, 4 GHz, the feedback divider 118 could divide the VCO clock by 40 such that the feedback clock frequency is the same the reference clock (i.e. 100 MHz).

Many mobile devices are battery powered. These devices typically go into a sleep mode and place components such as the VCO 116 in to a power conservation mode where the PLL 102 does not oscillate and will not provide an output. During startup, particularly from a sleep mode, the PLL bias is slowly raised such that the VCO 116 starts from a low frequency and increases its oscillating frequency towards the desired or target frequency. In one embodiment, the feedback divider 118 can be a "1/40" divider and can divide the output frequency by forty (40) so that when the VCO frequency is 1 GHz the feedback loop at the input to the PFD 110 will be operating at 25 MHz.

During the start up, the frequency detection module 104 can repeatedly reset the count of the feedback divider 118. Thus, the frequency divider 118 will toggle or count as cycles are present on its input from the output of the VCO 116. For every forty cycles on the input of the frequency divider 118, the frequency divider 118 can produce a single transition on its output. However, the output of the frequency divider 118 may not toggle until it reaches the proper count. Thus, if the VCO 116 output frequency is less than, or not up to the target frequency, the frequency detection module 104, utilizing the reference clock input and the VCO clock input can reset the frequency divider 118 to zero and the frequency divider 118 will begin counting again from zero and never produce an output.

In this "start up" mode, where the VCO oscillation frequency starts from zero hertz and hasn't reached the target frequency, say 4 GHz, the feedback clock frequency would be less than 100 MHz and the frequency divider 118 can repeatedly be reset before it reaches the max count value and provides an output transition to the PFD 110. Thus, the output of the frequency divider 118 or the feedback clock can be dormant until a VCO target frequency is reached.

The frequency detection module 104 can detect if the output signal of the VCO 116 has reached a predetermined frequency. Thus, once the output of the VCO 116 reaches the target frequency, determined by the refclk (both signals feed the flip-flop 120 at the input of the frequency detection module 120) the frequency detection module 104 will not reset the frequency divider 118 and the feedback loop will connect or close, commencing stable operation of the PLL 102. The reference clock can be synchronized with the VCO clock before the frequency detection module 104 resets the feedback divider.

When the VCO 116 reaches the target frequency, the frequency divider 118 will complete the count from one reference clock edge to the next and toggle the feedback clock. The first time that the feedback clock toggles at the PFD 110 can indicate that the oscillation frequency of the VCO 116 has reached the target frequency. When the oscillation is greater than or equal to the target frequency the startup mode can stop and the can PLL starts the feedback loop convergence process.

The edge detection circuit can sense when the feedback clock toggles utilizing flip-flop 126 and the output signal from the edge detection circuit 106 can be utilized to switch the PLL 102 from a start mode to an operating state. The output of the edge detection module 106 can enable the charge pump 112 and disable the pull up module 114 and disable the frequency detection module 104. When the FLPLL 102 gets shut down the edge detection circuit 106 can be reset and be placed in a startup mode.

It can be appreciated that the disclosed embodiment can achieve a lock in less than 450 ns. It can also be appreciated that traditional PLLs with alternate fast lock designs typically take more than 10,000 ns, thus, the device of the present disclosure can achieve a lock status or provide a useable clock signal twice as fast as existing PLLs. The new fast lock apparatus can provide a significant decrease in PLL lock times with only the addition of a few flip flops in the frequency counter 104 as illustrated in FIG. 1. Thus, the overhead cost including silicon area and current consumption is minimal particularly when compared to other apparatus that claim fast locking properties. The disclosed apparatus, methods and arrangements can be implemented on many different types of PLL architectures. For example PLLs often utilize different types of PFDs and such a modification would not part from the scope of the present disclosure.

It can be appreciated that the disclosed apparatus 100 will take less area and consume less current than previous fast lock phase locked loop designs because in one embodiment the addition of only few flip flops to a PLL can accomplish a faster start up time. As with many PLLs the PFD output can provide up/down pulses utilizing an exclusive OR gate.

Figure 2:
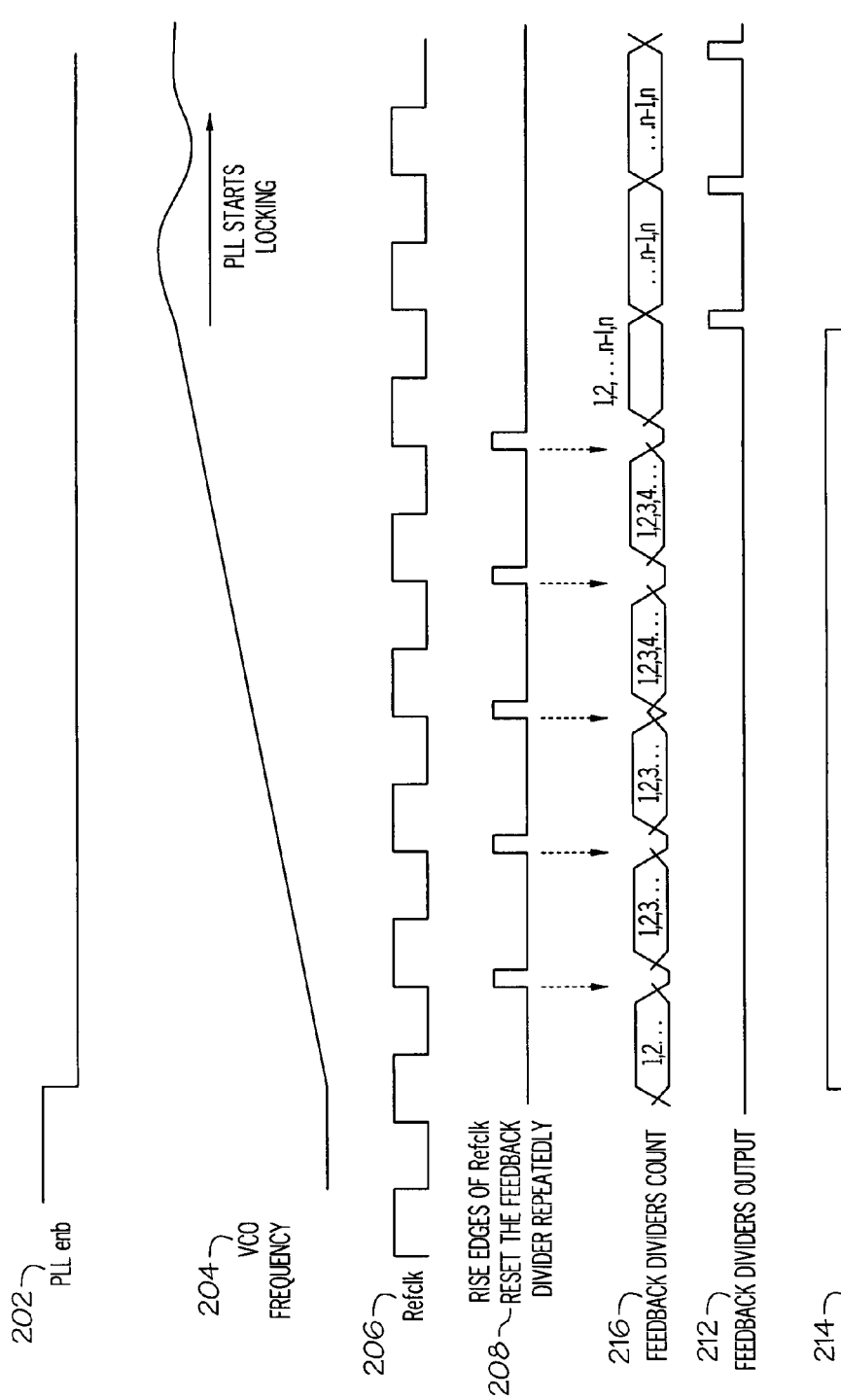
FIG. 2 illustrates a graph of possible timing diagrams for fast locking PLL.

FIG. 2 discloses signal waveforms 200 for one embodiment of a fast lock phase locked loop (FLPLL) such as the one described in FIG. 1. A PLL enable/disable signals is shown going low when the PLL is instructed to end a sleep mode and transition to an operational mode. At or near the same time the PLL enable/disable signal transitions, the start up signal 214 can transition high. The reference clock 206 can then toggle and the rising edges of the refclk can reset the feedback divider repeatedly as shown by the feedback divider count counting to a number less that the divider max value and then transitioning to reset the divider.

As illustrated, the VCO frequency 204 can continue to rise until the resets 208 signal ceases and the feedback divider output signal 212 will start clocking the PFD as the PLL starts to lock. This new fast lock technique brings the VCO to an oscillation frequency that is close or proximate to the target frequency such that the PLL has to adjust the VCO frequency by only small amounts, which eventually saves a lot of time during the locking process.

Figure 3:
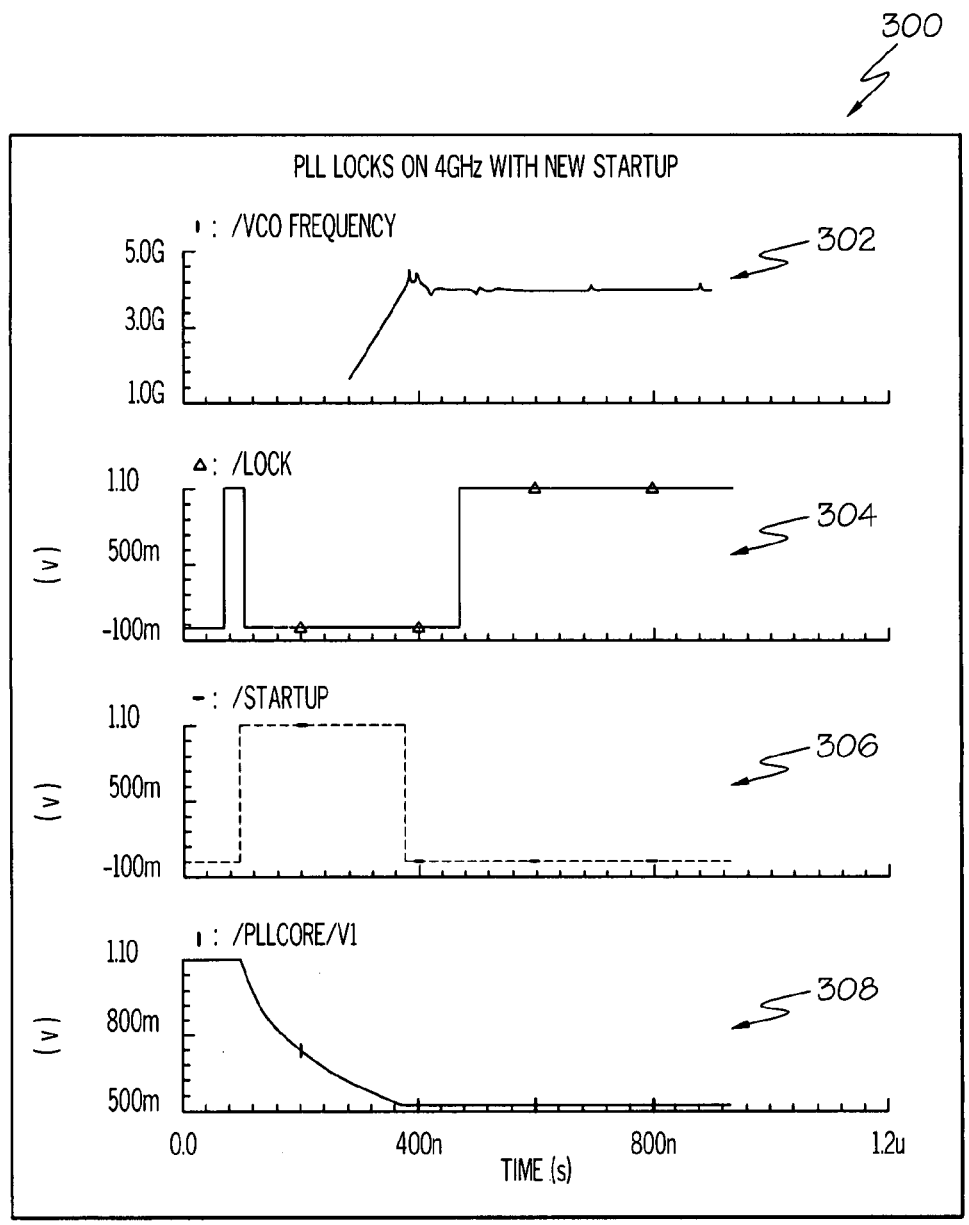
FIG. 3 illustrates a graph of possible waveforms for a PLL operating at 4 GHz.

Referring to FIG. 3 waveforms for a 4 GHz PLL is disclosed. Waveform 302 represents the VCO frequency and waveform 304 represents a control signal to start the PLL. Further waveform 306 represents the control signal that is active during the start up mode and waveform 308 represents the time required for a PLL to achieve a lock status.

Figure 4:
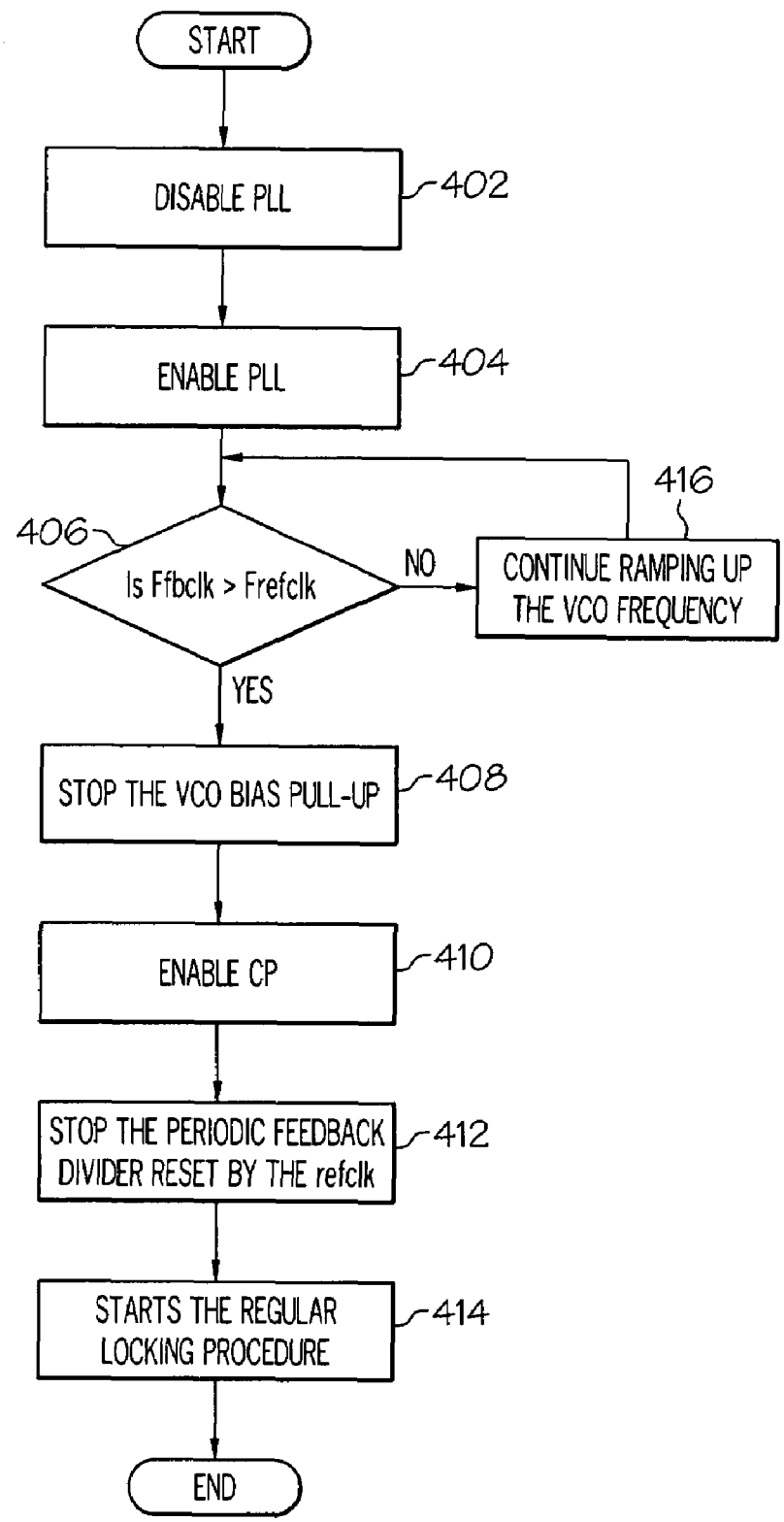
FIG. 4 illustrates a flow chart of a method for starting a PLL.

Referring to FIG. 4 a flow diagram is disclosed for a method of operating a phase locked loop (PLL) As illustrated by block 202 a PLL can be disable as a device enters a sleep mode of a power saving mode. As illustrated by block 204 the device can enable the PLL in a start-up mode. A voltage at the input if a voltage controlled oscillator (VCO) can be pulled up and the feedback clock can be compared to the reference clock as illustrated by block 206.

As illustrated in block 206, when the feedback clock has a frequency that is not greater than the reference clock the VCO can continue ramping up its output frequency in an in the start up mode open loop system as illustrated by block 216. When the feedback clock has a frequency that is greater than the reference clock the VCO bias pull up can be stopped as illustrated in block 208. Also the charge pump can be enabled as illustrated in block 210 and the frequency counter that resets the frequency divider can be disabled as illustrated in block 212. The PLL can start its regular locking procedure with full feedback as illustrated in block 214. The process can end thereafter.

Each process disclosed herein can be implemented with a software program. The software programs described herein may be operated on any type of computer, such as personal computer, server, etc. Any programs may be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet, intranet or other networks. Such signal-bearing media, when carrying computer-readable instructions that direct the functions of the present disclosure, represent embodiments of the present disclosure.

The disclosed embodiments can take the form of an entirely hardware embodiment, an entirely software embodiment or an embodiment containing both hardware and software elements. In a preferred embodiment, the disclosure is implemented in software, which includes but is not limited to firmware, resident software, microcode, etc. Furthermore, the embodiments can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD. A data processing system suitable for storing and/or executing program code can include at least one processor, logic, or a state machine coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

It will be apparent to those skilled in the art having the benefit of this disclosure that the present disclosure contemplates methods, systems, and media that provide a driver with situational awareness information. It is understood that the form of the embodiments shown and described in the detailed description and the drawings are to be taken merely as examples. It is intended that the following claims be interpreted broadly to embrace all the variations of the example embodiments disclosed.

What is claimed is:

1. An apparatus comprising:
   a phase frequency detector to accept a reference signal and a feedback signal from a feedback loop;
   a charge pump coupled to the phase frequency detector, the charge pump to be activated in an operational mode;
   a voltage controlled oscillator coupled to the phase frequency detector to accept a control signal from the phase frequency detector and to provide an output clock based on the control signal, the output signal having a frequency;
   a frequency detection module for comparison of the frequency of the output signal of the voltage controlled oscillator to a predetermined frequency, and, thereafter, to provide a control signal based on the comparison; and
   a frequency divider coupled to the phase frequency detector and to the voltage controlled oscillator to provide the feedback signal to the phase frequency detector, the control signal to enable or disable the feedback loop based on the comparison.

2. The apparatus of claim 1, further comprising a pull up voltage module to be disabled in an operational mode.

3. The apparatus of claim 1, wherein the frequency detection module comprises a state machine.

4. The apparatus of claim 1, wherein the frequency divider is disabled in a start up mode and enabled in an operational mode.

5. A method comprising:
   applying a bias voltage to bias a voltage controlled oscillator, the bias voltage causing the voltage controller oscillator to create a predetermined target frequency on an output;
   detecting an output frequency of the biased voltage controlled oscillator on the output;
   comparing the detected output frequency to a predetermined threshold frequency;
   disabling a feedback signal to the voltage controlled oscillator based on results of the comparing;
   disabling the bias voltage on the results of the comparing; and
   resetting a frequency counter in response to the output frequency being less than the predetermined threshold frequency.

6. The method of claim 5, further comprising synchronizing a reference clock with a VCO clock in response to a feedback divider being reset.

7. The method of claim 5, further comprising terminating a start up mode in response to the output frequency of the voltage controlled oscillator reaching the predetermined threshold frequency, wherein the terminating the startup mode comprises activating a charge pump.

8. The method of claim 5, further comprising terminating a start up mode in response to the output frequency of the voltage controlled oscillator reaching the predetermined threshold frequency, wherein the terminating comprises disabling a pull up module.

9. The method of claim 5, further comprising terminating a start up mode in response to the output frequency of the voltage controlled oscillator reaching the predetermined threshold frequency, wherein the terminating the startup mode comprises disabling a frequency counter module.

10. The method of claim 6, wherein the divider completes counting from one reference clock edge to the next and the feedback signal toggles indicating that the VCO has reached a target frequency.

* * * * *